(12) United States Patent
Fattal et al.

(10) Patent No.: US 7,965,381 B2
(45) Date of Patent: Jun. 21, 2011

(54) SELF-ALIGNED, SUB-WAVELENGTH OPTICAL LITHOGRAPHY

(75) Inventors: David Fattal, Palo Alto, CA (US); Jason Blackstock, Palo Alto, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 656 days.

(21) Appl. No.: 11/580,646

(22) Filed: Oct. 13, 2006

(65) Prior Publication Data
US 2008/0165338 A1   Jul. 10, 2008

(51) Int. Cl.
G03B 27/72  (2006.01)
G03F 7/26   (2006.01)

(52) U.S. Cl. .......................................... 355/71; 430/311
(58) Field of Classification Search .................. 430/311, 430/321, 394; 355/71, 77
See application file for complete search history.

(56) References Cited

U.S. PATENT DOCUMENTS

| | | | |
|---|---|---|---|
| 6,285,020 B1* | 9/2001 | Kim et al. | 250/216 |
| 2004/0115568 A1* | 6/2004 | Schmidt | 430/326 |
| 2005/0117845 A1* | 6/2005 | Hirose | 385/39 |
| 2005/0175937 A1* | 8/2005 | Bae | 430/312 |

OTHER PUBLICATIONS

M. Rahman, et al. "Theory of a Metal-Semiconductor Photodiode With Granting Coupling of the Incident Light to Surface Plasma Waves" J. Appl. Phys. 66 (1), Jul. 1, 1989.

* cited by examiner

*Primary Examiner* — Kathleen Duda
*Assistant Examiner* — Brittany Raymond

(57) ABSTRACT

Embodiments of the invention provide a method and an apparatus for performing self-aligned, sub-wavelength optical lithography. One embodiment provides a region of photoresist above a conductive surface having a plurality of periodically arrayed openings extending therethrough. At least a portion of the region of photoresist is then exposed to a light, wherein the intensity of the light is less than the intensity required to cure the photoresist. In so doing, at least one self-aligned, sub-wavelength location in at least one location of the region of photoresist is cured.

6 Claims, 8 Drawing Sheets

500

PROVIDES A REGION OF PHOTORESIST ABOVE A CONDUCTIVE LAYER HAVING A PLURALITY OF PERIODICALLY ARRAYED OPENINGS EXTENDING THERETHROUGH.
502

EXPOSES AT LEAST A PORTION OF SAID REGION OF PHOTORESIST TO A LIGHT, WHEREIN THE INTENSITY OF SAID LIGHT IS LESS THAN THE INTENSITY REQUIRED TO CURE SAID PHOTORESIST.
504

CURING AT LEAST ONE SELF-ALIGNED SUB-WAVELENGTH LOCATION IN AT LEAST ONE LOCATION OF SAID REGION OF PHOTORESIST.
506

SELF-ALIGNED, SUB-WAVELENGTH OPTICAL LITHOGRAPHY

TECHNICAL FIELD

The present invention generally relates to a method and apparatus for self-aligned, sub-wavelength optical lithography.

BACKGROUND ART

Generally, photolithography refers to a method of utilizing light to transfer a design onto a printed circuit boards or a wafer's surface. For example, in one operation, a semiconductor substrate is covered with a photoresist (light sensitive) layer. The photoresist layer is then masked such that the desired design is either the only part of the photoresist layer covered by the mask or not covered by the mask. The entire layer (e.g., photoresist layer and the mask layer) is then exposed to a single burst from a light source with enough energy to harden, or cure, the unmasked portions of the photoresist layer.

In the positive photolithography process, the portion of the resist that has been exposed to light is removed utilizing an etching method such as an acid bath, hot ions, or the like. In the negative photolithography process, the portion of the resist that has not been exposed to light is removed. That resist removal process is called "development". After development, the remaining resist constitute the wanted mask, and the underlying substrate is able to be etched However, there is one significant problem with the present state of photolithography and the growing desire for smaller designs. That is, the limitation in the size of the design that can be formed using the standard photolithographic methods. Presently, standard photolithographic process is limited to approximately the size of a wavelength of light. Thus, the ability to design tens or even few hundreds of nanometer size features using standard photolithographic techniques is practically impossible.

In order to overcome the shortcomings of the standard photolithographic process, more costly and time consuming methods such as electron beam lithography are utilized. In general, electron beam lithography refers to a method of significantly reducing the lithographic pattern size by using a beam of electrons that can be focused to much smaller areas than light.

For example, the beam width can be as small as approximately 10's of nanometers. However, this form of lithography is deleteriously slow. For example, the focused beam of electrons must be written across the surface in a serial fashion. Thus, the pattern generation performed by the electron beam lithography process is extremely slow when compared with the parallel exposure technique of photolithography.

DISCLOSURE OF THE INVENTION

Embodiments of the invention provide a method and an apparatus for performing self-aligned, sub-wavelength optical lithography. One embodiment provides a region of photoresist above a conductive surface having a plurality of periodically arrayed openings extending therethrough. At least a portion of the region of photoresist is then exposed to a light, wherein the intensity of the light is less than the intensity required to cure the photoresist. In so doing, at least one self-aligned, sub-wavelength location in at least one location of the region of photoresist is cured.

BRIEF DESCRIPTION OF THE DRAWINGS

The accompanying drawings, which are incorporated in and form a part of this application, illustrate embodiments of the present invention, and together with the description, serve to explain the principles of the invention. Unless noted, the drawings referred to this description should be understood as not being drawn to scale.

FIG. 5 is a flowchart of an exemplary method for performing self-aligned, sub-wavelength optical lithography in accordance with one embodiment of the present invention.

BEST MODE FOR CARRYING OUT THE INVENTION

Figure 1:
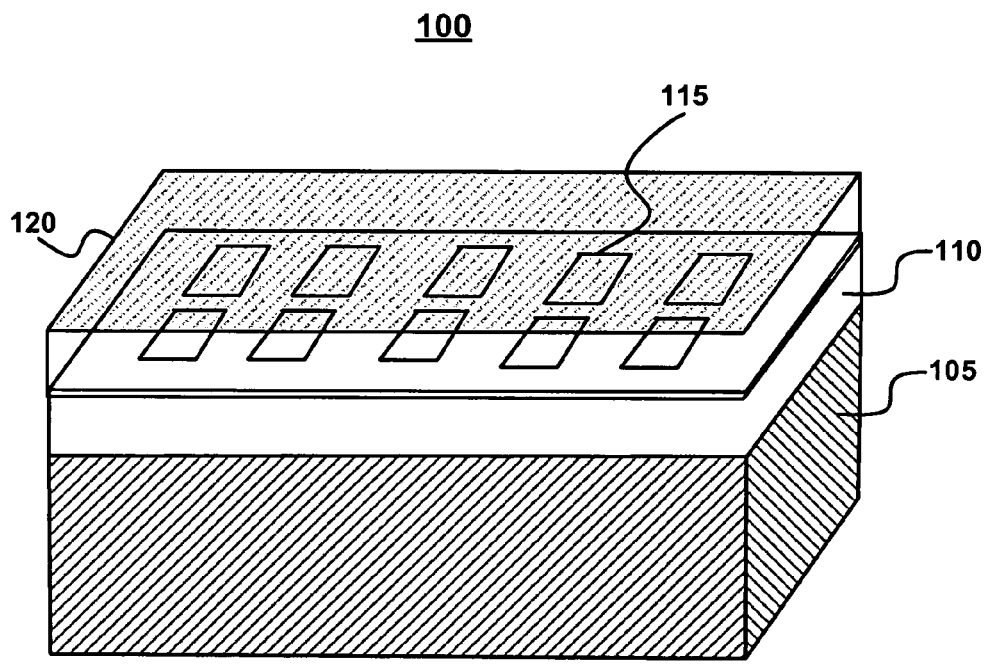
FIG. 1 is a perspective view of an exemplary lithographic object in accordance with one embodiment of the present invention.

Reference will now be made in detail to various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following description of the present invention, numerous specific details are set forth in order to provide a thorough understanding of the present invention. In other instances, well-known methods, procedures, objects, and circuits have not been described in detail as not to unnecessarily obscure aspects of the present invention.

Aspects of the present invention may be practiced on a computer system that includes, in general, a processor for processing information and instructions, random access (volatile) memory (RAM) for storing information and instructions, read-only (non-volatile) memory (ROM) for storing static information and instructions, a data storage device such as a magnetic or optical disk and disk drive for storing information and instructions, an optional user output device such as a display device (e.g., a monitor) for displaying information to the computer user, an optional user input device including alphanumeric and function keys (e.g., a keyboard) for communicating information and command selections to the processor, and an optional user input device such as a cursor control device (e.g., a mouse) for communicating user input information and command selections to the processor.

Overview

Embodiments of the technology described herein provide a method and apparatus for performing self-aligned, sub-wavelength optical lithography. In one embodiment, the object to be optically lithographed includes a conductive plate patterned with a periodic array of openings between a portion of semiconductor material and a layer of photoresist. During the photolithographic process, the provided light energy is less intense than the amount of light energy required to cure the photoresist. However, the effect of the pattern on the conductive plate is to couple the provided light within some range of wavelength and/or incidence angles to surface excitations of the metal surface called surface plasmons, thereby enhancing the electric field near the surface and resulting in dramatically increased energy levels at the previously designated location(s). In so doing, the low intensity light is converted into horizontal excitation which enhances the energy level of the light at one or more previously designated location(s) based on the periodically arrayed openings.

In other words, the present technology utilizes the low intensity light in conjunction with surface wave energy, on a conductive layer having pre-defined periodically arrayed openings, to cure a layer of photoresist with a special pattern determined by the planar field profile of the surface wave.

By significantly increasing the energy level of the light at the previously designated locations, the photoresist at the previously designated locations is cured while the rest of the layer of photoresist remains uncured. Moreover, the previously designated locations that are cured are significantly smaller, such as in one embodiment, by a factor of 15 or more, than the size of the periodically arrayed openings.

Thus, it is possible to utilize single burst optical lithography to cure a portion of photoresist on the order of tens of nanometers (nm). Furthermore, the previously designated locations remain fixed as long as the periodically arrayed openings remain fixed. In other words, it is possible to utilize photolithography to cure a portion of photoresist on the order of tens of nm at a self-aligned, known and repeatable location. That is, significant reduction in photoresist cure size is realized without requiring any significant measure of light energy alignment during the photolithographic process.

Structure

With reference now to FIG. 1, a perspective view of an exemplary photolithographic object 100 is shown in accordance with one embodiment of the present invention. In general, photolithographic object 100 refers to an object or structure that is meant to be subjected to a photolithographic process.

In general, the photolithographic process referred to herein is an optical lithographic process that uses a single burst from a light source that is large enough to cover the entire area of photoresist. However, the present technology is also readily able to use multiple bursts from a light source, multiple light sources, a plurality of single bursts that are each aimed at a different area of said photoresist layer, a combination thereof and the like. Thus, the use of a single burst from a light source that is large enough to cover the entire area of photoresist is merely one embodiment and is provided herein merely for purposes of brevity and clarity.

With reference again to FIG. 1, in one embodiment, photolithographic object 100 includes a region of semiconductor material 105, a conductive layer 110 having a plurality of periodically arrayed openings 115 therethrough and a layer of photoresist 120. In one embodiment, the semiconductor material 105 may be a material such as single crystal silicon, amorphous silicon, organic matter or the like. In one embodiment, conductive layer 110 may be formed from a metal. For example, in one embodiment, conductive layer 110 is formed from silver.

In one embodiment, the present technology may utilize the second conductive surface having a two-dimensional periodic array of openings therethrough. By utilizing a two-dimensional periodic array of openings, e.g., a two-dimensional grating, the present technology is capable of coupling both the polarization of the light as well as any or all incidence angles of the light being received with the surface plasmons present on the conductive plate.

Figure 2:
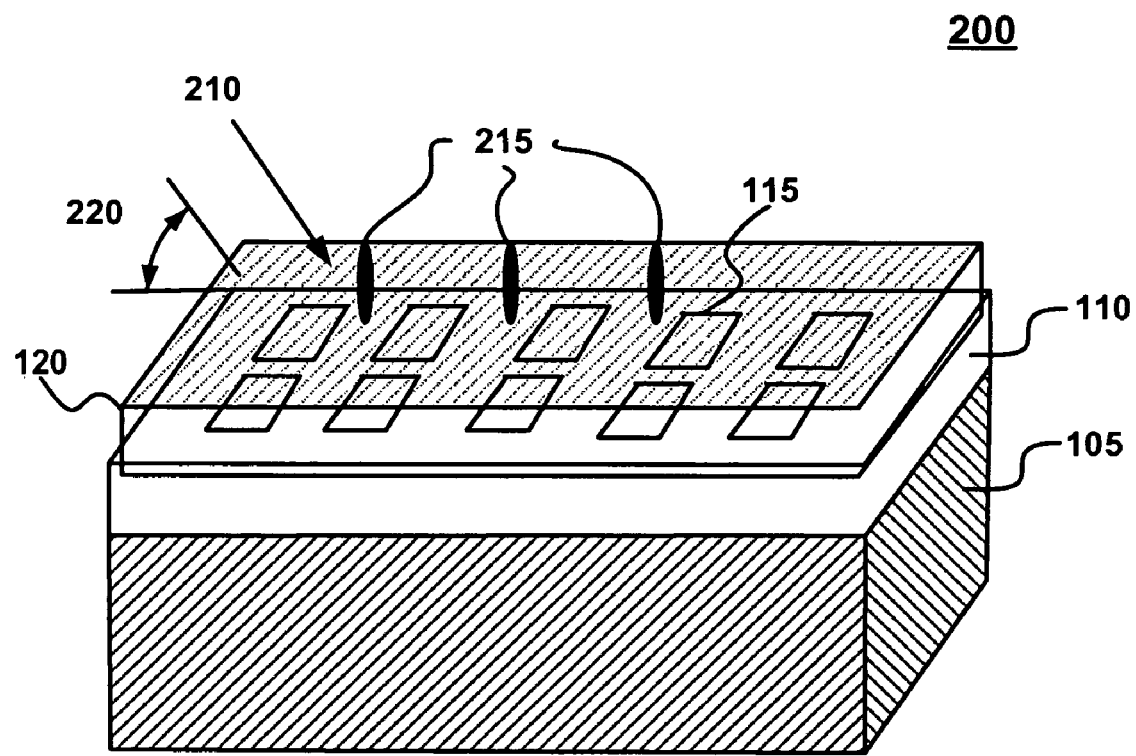
FIG. 2 is a perspective view of low intensity light and an exemplary resulting cured photoresist region in accordance with one embodiment of the present invention.

Referring now to FIG. 2, a perspective view of low intensity light 210 and an exemplary resulting cured photoresist region 220 for an exemplary photolithographic object 200 is shown in accordance with one embodiment of the present invention.

In general, photolithographic object 200 includes a region of material to be etched 105, a conductive layer 110 having a plurality of periodically arrayed openings 115 therethrough and a layer of photoresist 120. For this reason, photolithographic object 200 is similar to that described in reference to FIG. 1.

However, FIG. 2 also includes low intensity light 210 which is received at the conductive layer 110 at an angle of incidence 220. In general, low intensity light 210 may be any type of low intensity light energy. For example, low intensity light 210 may be generated from a light bulb, a light emitting diode and the like.

In one embodiment, the amount of energy provided by low intensity light 210 is based on the level of light energy required to cure the layer of photoresist 120. In other words, the level of energy of the low intensity light 210 will be lower than the energy level required to cure the layer of photoresist 120 exposed to the low intensity light 210. Furthermore, in one embodiment, the level of energy of the low intensity light 210 is adjustable based on the type of photoresist utilized. For example, a photoresist layer with a lower energy cure threshold may receive a low intensity light 210 that has been adjusted to provide less energy to remain below the photoresist cure threshold. However, a photoresist layer with a higher energy cure threshold may receive a low intensity light 210 that has been adjusted to provide more energy while remaining below the photoresist cure threshold.

Moreover, the energy level of the low intensity light 120 may be adjusted to cure areas of different sizes. For example, in one embodiment, the energy level of low intensity light 120 may be set just below the cure level energy of the photoresist 120 resulting in a larger cured area of photoresist at focal points 215. In another embodiment, the energy level of low intensity light 120 may be set well below the cure level energy of the photoresist 120 (e.g., half or the like) resulting in a smaller cured area of photoresist at focal points 215.

In one embodiment, the angle of incidence 220 of the low intensity light 210 may be adjusted by adjusting the source of low intensity light 210, by rotating or moving the photolithographic object 200 or by a combination thereof. This allows the operator to change the lithography pattern in a simple way.

Figure 3A:
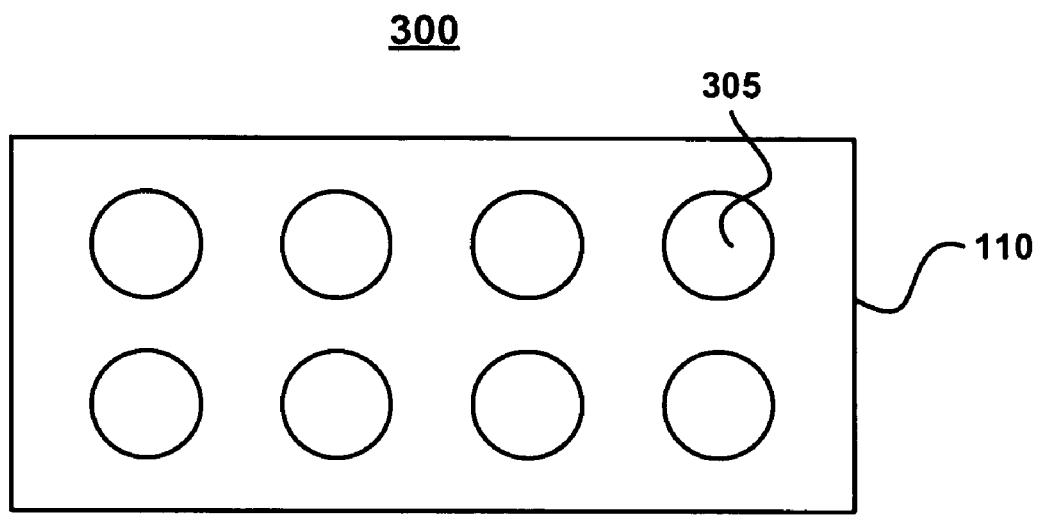
FIG. 3A is a top view of an exemplary conductive surface having a plurality of periodically arrayed openings in accordance with one embodiment of the present invention.

With reference now to FIG. 3A, a top view 300 of an exemplary conductive surface 110 having a plurality of periodically arrayed openings 305 is shown in accordance with one embodiment of the present invention.

The openings 305 are provided herein as one of the plurality of possible geometrically configured openings that may be used. That is, although the openings are shown as circles in a plurality of rows, they are merely one of the pluralities of possible periodic arrays which may be utilized in conjunction with the present technology to form self-aligned, sub-wavelength cured photoresist areas when exposed to optical lithography.

Figure 3B:
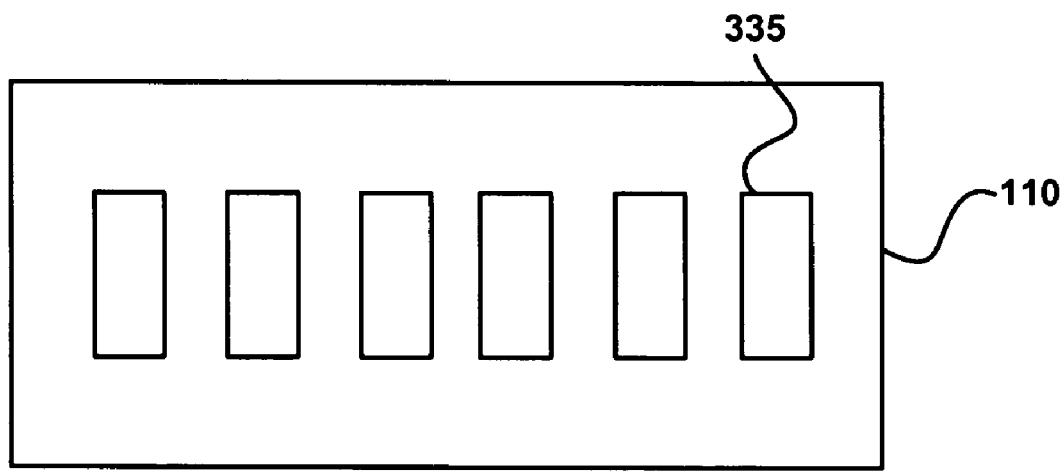
FIG. 3B is a top view of an exemplary conductive surface having a plurality of periodically arrayed openings in accordance with another embodiment of the present invention.

Referring now to FIG. 3B, a top view 325 of an exemplary conductive surface 110 having a plurality of periodically arrayed rectangular openings 335 is shown in accordance with another embodiment of the present invention.

The openings 335 are provided herein as one of the plurality of possible geometrically configured openings that may be used. That is, although the openings are shown as rectangles and are shown in a single row, they are merely one of the pluralities of possible periodic arrays which may be utilized in conjunction with the present technology to form self-aligned, sub-wavelength cured photoresist areas when exposed to optical lithography.

Figure 3C:
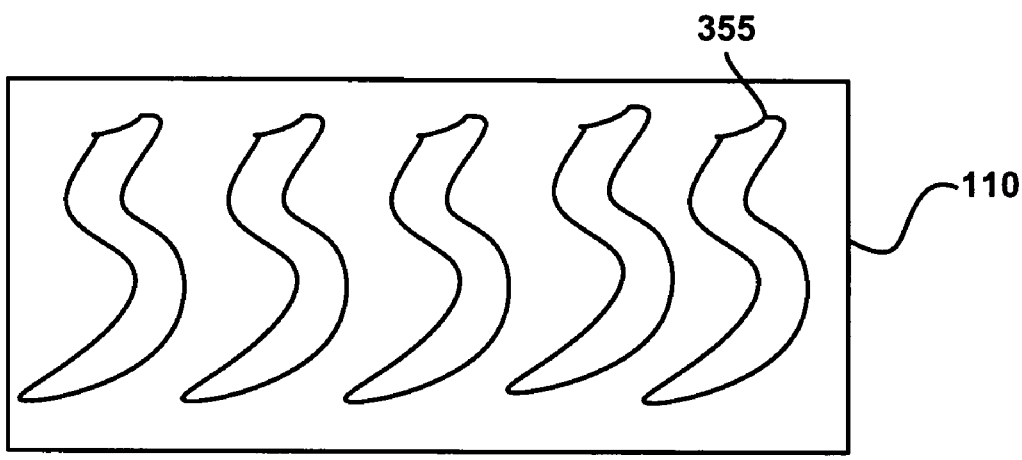
FIG. 3C is a top view of an exemplary conductive surface having a plurality of periodically arrayed openings in accordance with yet another embodiment of the present invention.

With reference now to FIG. 3C, a top view 350 of an exemplary conductive surface 110 having a plurality of periodically arrayed generic openings 355 is shown in accordance with yet another embodiment of the present invention.

The openings 355 are provided herein as one of the plurality of possible generic configured openings that may be used. That is, although the openings are shown as non-geometric shapes and are shown in a single row, they are merely one of the pluralities of possible periodic arrays which may be utilized in conjunction with the present technology to form self-aligned, sub-wavelength cured photoresist areas when exposed to optical lithography. Although a plurality of possible periodically arrayed openings are described herein, they are not inclusive. That is, the present technology is well suited to any number, shape or design of periodically arrayed openings depending on the shape of photoresist region 215 to be cured.

Figure 4A:
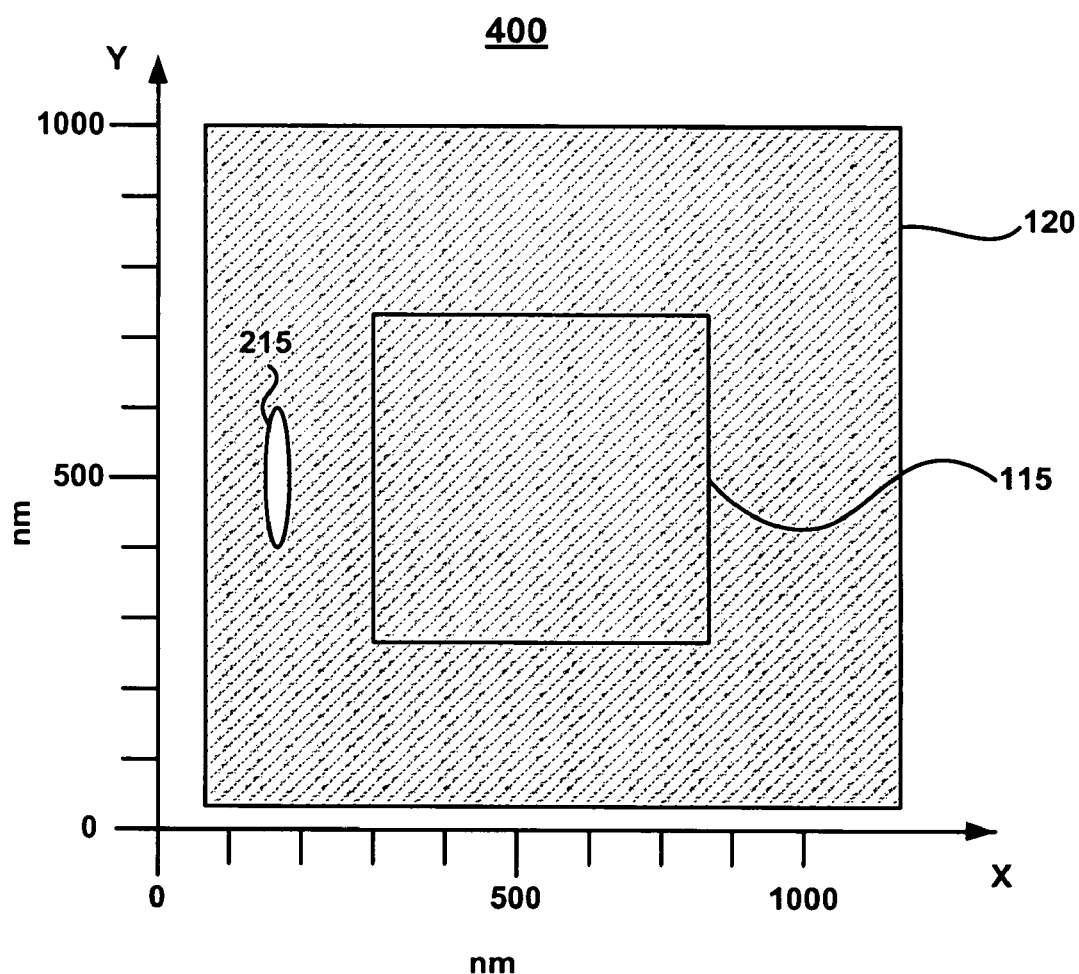
FIG. 4A is a top view of an exemplary cured photoresist region in relation to one of a plurality of periodically arrayed openings in accordance with another embodiment of the present invention.

Referring now to FIG. 4A, a top view of an exemplary cured photoresist region 215 graphically displayed in relation to one of a plurality of periodically arrayed openings 115 is shown in accordance with one embodiment of the present invention. In general, graph 400 illustrates an exemplary dimensional advantage that is realized with the utilization of the present technology for curing self-aligned, sub-wavelength photoresist locations using low intensity optical lithography. Although only a single opening 115 is shown in the conductive surface 110 of FIG. 4A, it is understood that the actual conductive surface may have a plurality of periodically arrayed openings 115. The presentation of the single opening 115 is shown herein merely for purposes of brevity and clarity.

In one embodiment, the opening 115, within the conductive layer 110, includes an initial pattern that is approximately 500 nm by 500 nm. The initial opening(s) 115 may be formed using standard lithography techniques, molding, milling or any of a various other number of techniques for forming a plurality of periodically arrayed openings 115 within a conductive layer 110.

Although the initial pattern is described as having opening(s) 115 that are approximately 500 nm by 500 nm, this is merely exemplary. That is, the initial pattern may be of any size and shape and may further be dependent on the desired shape of the self-aligned, sub-wavelength photoresist pattern to be cured. The use of approximately 500 nm by 500 nm as the opening is utilized herein for purposes of description and is provided merely for purposes of brevity and clarity.

Referring still to FIG. 4A, cured photoresist region 215 is the area of the photoresist layer 120 that is cured when the low intensity light interacts with the plasmons of conductive surface 110 having the periodically arrayed openings 115 therethrough. In other words, when low intensity light 210 (of FIG. 2) interacts with the plasmons on the conductive surface 110, the plurality of periodically arrayed openings 115 provide focused areas of increased energy resulting in a cured photoresist region 215. Moreover, because a same configuration of periodically arrayed openings 115 always generate the same focused areas of increased energy, the resulting cured photoresist region 215 is self-aligning, sub-wavelength, repeatable, and the like.

As shown in FIG. 4A, in one embodiment, the cured photoresist region 215 is reduced in the x-direction by a factor of approximately 15 while it is also reduced in the y-direction by a factor of approximately 3. In other words, the present optical lithography method is able to provide a photoresist cure region that is approximately 33 nm by 167 nm. Moreover, as is shown in FIG. 4B, the process is repeatable and self-aligning.

Furthermore, the present optical lithography method can utilize an opening 115 that was formed from a previously performed process such as that described herein to provide even smaller cured regions. That is, the openings 115 may be the product of a previous optical lithographic process such that the openings 115 that are utilized are a periodic array formed from the cured regions 215. For example, the conductive layer 110 may have periodic array of openings 115 formed from the previous photolithographic process. That is, in one embodiment, the conductive layer 110 may have openings approximately 33 nm by 167 nm.

Utilizing one of the methods described herein, the same photolithographic process may be used with the period array of smaller openings 115 in a new conductive layer 110 to form openings in a new layer of photoresist resulting in a different lithography pattern. In addition, since the method is self-aligning, there is no need to focus a beam, or search for the location of the resultant cured region(s) 215.

Figure 4B:
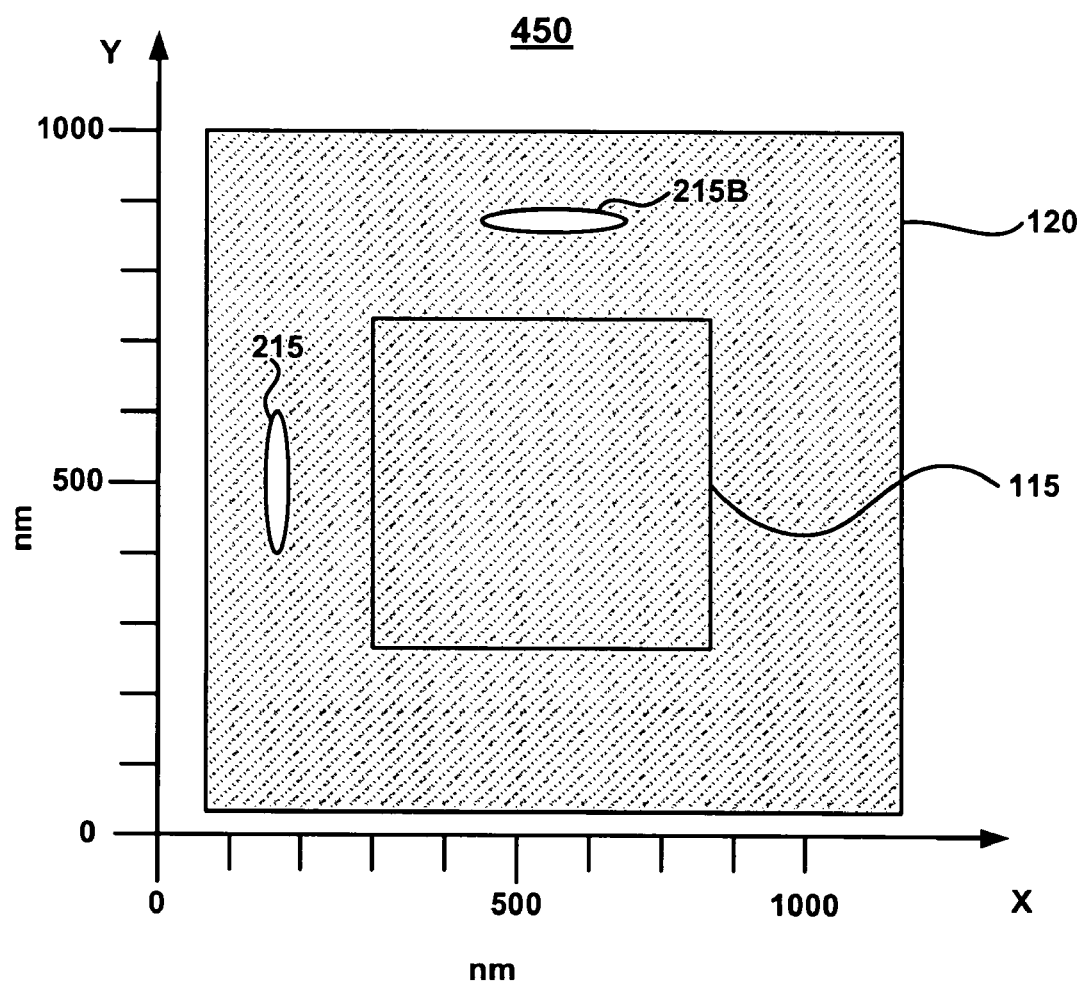
FIG. 4B is a top view of an exemplary first and second cured photoresist region in relation to one of a plurality of periodically arrayed openings in accordance with another embodiment of the present invention.

With reference now to FIG. 4B, a top view of an exemplary first 215 and second 215B cured photoresist region in relation to one of a plurality of periodically arrayed openings 115 is shown in accordance with another embodiment of the present invention. In one embodiment, the details and description of FIG. 4B are similar in form and function as that of FIG. 4A and are not repeated herein for purposes of brevity and clarity.

However, FIG. 4B illustrates the repeatability of the self-aligning, sub-wavelength photolithographic process described herein. For example, the cured region 215B is formed in the same photoresist layer as the initial cured region 215. That is, the cured region 215B is formed by adjusting the angle of incidence of the low intensity light 210 and then re-exposing the photoresist layer 120 to the low intensity light 210.

In another embodiment, the cured region 215B is formed by adjusting the polarization of the low intensity light 210 and then re-exposing the photoresist layer 120 to the low intensity light 210. In yet another embodiment, the cured region 215B is formed by rotating the lithographic object and then re-exposing the photoresist layer 120 to the low intensity light 210. For example, in one embodiment, a lithographic object rotator is configured to rotate the lithographic object with respect to the light to modify the size or shape of the at least one self-aligned, sub-wavelength location to be cured. In a further embodiment, the cured region 215B is formed by a combination of two or more of the adjustment methods described herein. Although two regions, e.g., 215 and 215B are shown, it is appreciated that the process may be repeated any number of times utilizing any of the combinations of adjustments to form more or fewer cured regions.

Operation

Referring now to FIG. 5, a flowchart of an exemplary method for performing self-aligned, sub-wavelength optical lithography is shown in accordance with one embodiment of the present invention.

With reference now to 502 of FIG. 5 and to FIG. 2, one embodiment provides a region of photoresist 120 above a conductive layer 110 having a plurality of periodically arrayed openings 115 extending therethrough. As described herein, the photoresist 120 may be any of a plurality of known photoresists.

Referring now to 504 of FIG. 5 and to FIG. 2, one embodiment exposes at least a portion of the region of photoresist 120 to a light 210, wherein the intensity of the light is less than the intensity required to cure the photoresist 120. As described herein, the level of energy of the low intensity light 210 will be lower than the energy level required to cure the layer of photoresist 120 exposed to the low intensity light 210.

In one embodiment, the level of energy of the low intensity light 210 is also adjustable based on the type of photoresist utilized. For example, a photoresist layer with a lower energy cure threshold may receive a low intensity light 210 that has been adjusted to provide less energy to remain below the photoresist cure threshold. However, a photoresist layer with a higher energy cure threshold may receive a low intensity light 210 that has been adjusted to provide more energy while remaining below the photoresist cure threshold.

With reference now to 506 of FIG. 5 and to FIG. 2, one embodiment cures at least one self-aligned, sub-wavelength location (cured region 215) in at least one location of the region of photoresist 120.

For example, the photolithographic object 200 is configured such that when the low intensity light 210 strikes a conductive plate 115, having openings 125 therethrough, at least one point of focus (e.g., cured region 215) is realized. That is, the point of focus (e.g., cured region 215) will be an area where the resultant energy level is high enough to cure the photoresist layer 120. This change in energy level at the point of focus is due to a surface excitation of the conductive layer 110 that can be modified based on the shape and periodicity of the openings 115 therethrough. In one embodiment, the shape and periodicity of the openings 115 in the conductive layer 110 are referred to as grating.

For example, the grating allows low intensity light 210 to communicate with surface plasmons at the conductive layer 110. Thus, for a particular array of openings (controlled by changing the spacing, periodicity and/or shape of the openings in the grating, or adjusting aspects of the low intensity light 210, such as polarization, angle, etc.) low intensity light 210 can be converted into horizontal excitation of higher energy at the points of focus. For example, there is a mode overlap between the surface plasmons and the low intensity light 210 which provides an increase in the energy level at certain regions of the photoresist layer 120 for photolithographic object 200. In one embodiment, the location of the increased energy levels is based on the periodic pattern of openings 115 as well as the shape of the openings 115 in the conductive layer 110.

In general, mode overlap refers to the plasmon modes (or surface wave) and the low intensity light 210 modes. For example, on a flat surface, the plasmon modes of the conductive layer 110 exist but have no overlap with free space. That is, the vectors are orthogonal. However, by adding a grating to the surface, e.g., the plurality of openings 115 in conductive layer 110, a non-orthogonal component is added to the plasmon modes on the surface. This non-orthogonal component allows free space modes, e.g., modes from the low intensity light 210, to resonantly couple with the plasmon modes on the surface of the conductive layer 110. The resulting mode overlap provides the increased horizontal excitation.

In other words, during the conversion into horizontal excitation, energy is accumulated on the surface of the conductive layer 110. By modifying the size, shape, and periodicity of the grating, the location, shape and size of any high energy areas on the conductive surface 110 that are capable of curing photoresist layer 120 are also adjustable. Thus, the location of the high energy areas within the photoresist 120 is pre-defined based on the grating design. This pre-definition result in a photolithographic system that provides a self-aligning, sub-wavelength photoresist cure region 215.

In other words, in one embodiment, the low intensity light 210 interacts with the conductive layer 110 having the periodically arrayed openings 125 therein. The interaction with the conductive layer 110 significantly increases the energy characteristics of the low intensity light 210 at pre-defined regions 215. The self-aligned, sub-wavelength location 215 to be cured is based on the periodic array of the openings 115. For example, one period array of openings 115 will result in the formation of a cured region 215 such as that shown in FIG. 4A.

However, by modifying the periodicity of the plurality of periodically arrayed openings, the at least one self-aligned, sub-wavelength location of the cured photoresist region 215 will also be modified. Moreover, by modifying the periodicity of the plurality of periodically arrayed openings, the shape and/or size of the cured photoresist region 215 will also be modified. In the same manner, modifying a shape of the plurality of periodically arrayed openings may also be used to modify the size or shape of the at least one self-aligned, sub-wavelength cured photoresist region 215.

Furthermore, in one embodiment, modifying the angle of incidence 220 of the low intensity light 210 may also be used to modify the size, shape and/or location of the at least one self-aligned, sub-wavelength cured photoresist region 215. In yet another embodiment, modifying the polarization of the light may be used to modify the size, shape and/or location of the at least one self-aligned, sub-wavelength cured photoresist region 215.

In addition, when the angle of incidence of low intensity light 210, the polarization of low intensity light 210 or the orientation of the lithographic object is modified or adjusted, at least the portion of the region of photoresist 120 previously exposed to the low intensity light 210 may be re-exposed thereby curing a second self-aligned, sub-wavelength photoresist region 215 in a second location of the region of photoresist 120 (as shown in FIG. 4B).

Furthermore, the orientation of the photolithographic object 200 with respect to the low intensity light 210 may be changed to modify the size, shape and/or location of cured photoresist region 215. That is, during the operational phase of the photolithographic object 200, the angle of incidence 220 between the conductive surface 110 having the periodically arrayed openings 115 thereon and the low intensity light 210 may be adjusted to modify the size, shape and/or location of cured photoresist region 215.

Thus, embodiments of the present invention provide a method and apparatus for performing self-aligned, sub-wavelength optical lithography. One embodiment further provides a method and apparatus for performing self-aligned, sub-wavelength optical lithography which decreases the size of the photoresist location to be cured utilizing standard a single burst optical lithography process. Embodiments further provide a method and apparatus for performing self-aligned, sub-wavelength optical lithography which decreases the size of the photoresist location to be cured without modifying the optical lithography process. Furthermore, significant time and cost savings can be realized due to the ability to use optical lithography that is self-aligning thereby requiring no expensive or time consuming alignment activities.

Embodiments of the present invention are thus described. While the present invention has been described in particular embodiments, it should be appreciated that the present invention should not be construed as limited by such embodiments, but rather construed according to the following claims.

We claim:

1. A self-aligning sub-wavelength system for optical lithography comprising:
   a lithographic object comprising:
      a conductive surface coupled with a semiconductor layer, said conductive surface having a plurality of periodically arrayed openings extending therethrough; and
      a region of photoresist coupled to said conductive surface; and
   a light source having an intensity that is less than the intensity required to cure said photoresist, wherein said light source is configured to interact with said lithographic object to cure at least one self-aligned, sub-wavelength location in at least one location of said region of photoresist.

2. The self-aligning sub-wavelength system of claim 1 further comprising:
   a periodic array periodicity modifier configured to modify a periodicity of said plurality of periodically arrayed openings to modify the size or shape of said at least one self-aligned, sub-wavelength location to be cured.

3. The self-aligning sub-wavelength system of claim 1 further comprising:
   a periodic array shape modifier configured to modify a shape of said plurality of periodically arrayed openings to modify the size or shape of said at least one self-aligned, sub-wavelength location to be cured.

4. The self-aligning sub-wavelength system of claim 1 further comprising:
   a light source angle of incidence modifier configured to modify the angle of incidence of said light to modify the size or shape of said at least one self-aligned, sub-wavelength location to be cured.

5. The self-aligning sub-wavelength system of claim 1 further comprising:
   a light source polarization modifier configured to modify the polarization of said light to modify the size or shape of said at least one self-aligned, sub-wavelength location to be cured.

6. The self-aligning sub-wavelength system of claim 1 further comprising:
   a lithographic object rotator configured to rotate the lithographic object with respect to said light to modify the size or shape of said at least one self-aligned, sub-wavelength location to be cured.

* * * * *